United States Patent
Hayden et al.

(10) Patent No.: US 7,205,784 B2
(45) Date of Patent: Apr. 17, 2007

(54) PROBE FOR COMBINED SIGNALS

(75) Inventors: Leonard Hayden, Beaverton, OR (US); Scott Rumbaugh, Tigard, OR (US); Mike Andrews, Hillsboro, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 11/442,503

(22) Filed: May 25, 2006

(65) Prior Publication Data

US 2006/0214677 A1   Sep. 28, 2006

Related U.S. Application Data

(60) Continuation of application No. 11/077,810, filed on Mar. 9, 2005, now Pat. No. 7,075,320, which is a continuation of application No. 10/928,688, filed on Aug. 26, 2004, now Pat. No. 7,046,023, which is a continuation of application No. 10/712,579, filed on Nov. 12, 2003, now Pat. No. 6,806,724, which is a division of application No. 10/294,130, filed on Nov. 13, 2002, now Pat. No. 6,724,205.

(51) Int. Cl.
*G01R 31/26* (2006.01)

(52) U.S. Cl. .................................... 324/767
(58) Field of Classification Search ........... None
See application file for complete search history.

(56) References Cited

U.S. PATENT DOCUMENTS

| | | |
|---|---|---|
| 3,445,770 A | 5/1969 | Harmon |
| 3,700,998 A | 10/1972 | Lee et al. |
| 3,849,728 A | 11/1974 | Evans |
| 4,593,243 A | 6/1986 | Lao et al. |
| 4,663,840 A | 5/1987 | Ubbens |
| 4,697,143 A | 9/1987 | Lockwood et al. |
| 4,727,319 A | 2/1988 | Shahriary |
| 4,749,942 A | 6/1988 | Sang et al. |
| 4,791,363 A | 12/1988 | Logan |
| 4,795,962 A | 1/1989 | Yanagawa et al. |
| 4,849,689 A | 7/1989 | Gleason et al. |
| 4,871,964 A | 10/1989 | Boll et al. |

(Continued)

FOREIGN PATENT DOCUMENTS

EP    230348    7/1985

(Continued)

OTHER PUBLICATIONS

Basu, Saswata and Gleason, Reed "A Membrane Quadrant Probe for R&D Applications" Technical Document—Jun. 1997.
"Air Coplanar™ Probe Series," 2000, Cascade Microtech Inc., Beaverton, Oregon.
"Electro-Optical Component Test," 2001, Cascade Microtech Inc., Beaverton, Oregon.

\* cited by examiner

*Primary Examiner*—Ha Tran Nguyen
*Assistant Examiner*—Trung Q. Nguyen
(74) *Attorney, Agent, or Firm*—Chernoff, Vilhauer, McClung & Stenzel

(57) ABSTRACT

A direct current and a modulation signal are simultaneously applied to contact pads on a device under test, such as a laser diode, with a probe that reduces signal distortion and power dissipation by transmitting a modulated signal through an impedance matching resistor and transmitting of a direct current over a second signal path that avoids the impedance matching resistor.

3 Claims, 5 Drawing Sheets

U.S. PATENT DOCUMENTS

| | | | |
|---|---|---|---|
| 4,891,584 A | 1/1990 | Kamieniecki et al. | |
| 4,894,612 A | 1/1990 | Drake et al. | |
| 4,983,910 A | 1/1991 | Majidi-Ahy et al. | |
| 4,998,062 A | 3/1991 | Ikeda | |
| 5,021,186 A | 6/1991 | Ota et al. | |
| 5,045,781 A | 9/1991 | Gleason et al. | |
| 5,126,286 A | 6/1992 | Chance | |
| 5,136,237 A | 8/1992 | Smith et al. | |
| 5,274,336 A | 12/1993 | Crook | |
| 5,293,175 A | 3/1994 | Hemmie | |
| 5,371,654 A | 12/1994 | Beaman et al. | |
| 5,441,690 A | 8/1995 | Ayala-Esquilin et al. | |
| 5,453,404 A | 9/1995 | Leedy | |
| 5,476,211 A | 12/1995 | Khandros | |
| 5,506,515 A | 4/1996 | Godshalk et al. | |
| 5,531,022 A | 7/1996 | Beaman et al. | |
| 5,537,372 A | 7/1996 | Albrecht | |
| 5,565,788 A | 10/1996 | Burr et al. | |
| 5,601,740 A | 2/1997 | Eldridge et al. | |
| 5,621,333 A | 4/1997 | Long et al. | |
| 5,635,846 A | 6/1997 | Beaman et al. | |
| 5,700,844 A | 12/1997 | Hedrick et al. | |
| 5,726,211 A | 3/1998 | Hedrick et al. | |
| 5,742,174 A | 4/1998 | Kister et al. | |
| 5,756,021 A | 5/1998 | Hendrick et al. | |
| 5,772,451 A | 6/1998 | Dozier, II et al. | |
| 5,773,780 A | 6/1998 | Eldridge et al. | |
| 5,785,538 A | 7/1998 | Beaman et al. | |
| 5,804,607 A | 9/1998 | Hedrick et al. | |
| 5,806,181 A | 9/1998 | Khandros et al. | |
| 5,810,607 A | 9/1998 | Shih et al. | |
| 5,811,982 A | 9/1998 | Beaman et al. | |
| 5,813,847 A | 9/1998 | Eroglu | |
| 5,814,847 A | 9/1998 | Shihadeh | |
| 5,820,014 A | 10/1998 | Dozier, II et al. | |
| 5,821,763 A | 10/1998 | Beaman et al. | |
| 5,829,128 A | 11/1998 | Eldridge et al. | |
| 5,832,601 A | 11/1998 | Eldridge et al. | |
| 5,838,160 A | 11/1998 | Beaman et al. | |
| 5,864,946 A | 2/1999 | Eldridge et al. | |
| 5,878,486 A | 3/1999 | Eldridge et al. | |
| 5,884,398 A | 3/1999 | Eldridge et al. | |
| 5,900,738 A | 5/1999 | Khandros et al. | |
| 5,912,046 A | 6/1999 | Eldridge et al. | |
| 5,914,613 A | 6/1999 | Gleason et al. | |
| 5,914,614 A | 6/1999 | Beaman et al. | |
| 5,917,707 A | 6/1999 | Khandros et al. | |
| 5,926,951 A | 7/1999 | Khandros et al. | |
| 5,966,645 A * | 10/1999 | Davis | 455/108 |
| 5,974,662 A | 11/1999 | Eldridge et al. | |
| 5,983,493 A | 11/1999 | Eldridge et al. | |
| 5,994,152 A | 11/1999 | Khandros | |
| 5,998,228 A | 12/1999 | Eldridge et al. | |
| 5,998,864 A | 12/1999 | Khandros et al. | |
| 6,023,103 A | 2/2000 | Chang et al. | |
| 6,029,344 A | 2/2000 | Khandros et al. | |
| 6,032,356 A | 3/2000 | Eldridge et al. | |
| 6,033,935 A | 3/2000 | Dozier, II et al. | |
| 6,042,712 A | 3/2000 | Mathieu | |
| 6,043,563 A | 3/2000 | Eldridge et al. | |
| 6,049,976 A | 4/2000 | Khandros | |
| 6,050,829 A | 4/2000 | Eldridge | |
| 6,054,651 A | 4/2000 | Fogel et al. | |
| 6,062,879 A | 5/2000 | Beaman et al. | |
| 6,064,213 A | 5/2000 | Khandros et al. | |
| 6,078,500 A | 6/2000 | Beaman et al. | |
| 6,090,261 A | 7/2000 | Mathieu | |
| 6,104,201 A | 8/2000 | Beaman et al. | |
| 6,110,823 A | 8/2000 | Eldridge et al. | |
| 6,114,864 A | 9/2000 | Soejima et al. | |
| 6,118,287 A | 9/2000 | Boil et al. | |
| 6,150,186 A | 11/2000 | Chen et al. | |
| 6,168,974 B1 | 1/2001 | Chang et al. | |
| 6,174,744 B1 | 1/2001 | Watanabe et al. | |
| 6,184,053 B1 | 2/2001 | Eldridge et al. | |
| 6,184,587 B1 | 2/2001 | Khandros et al. | |
| 6,206,273 B1 | 3/2001 | Beaman et al. | |
| 6,208,225 B1 | 3/2001 | Miller | |
| 6,211,663 B1 | 4/2001 | Moulthrop et al. | |
| 6,215,196 B1 | 4/2001 | Eldridge et al. | |
| 6,215,295 B1 | 4/2001 | Smith, III | |
| 6,215,670 B1 | 4/2001 | Khandros | |
| 6,218,910 B1 | 4/2001 | Miller | |
| 6,229,327 B1 | 5/2001 | Boll et al. | |
| 6,232,149 B1 | 5/2001 | Dozier, II et al. | |
| 6,242,803 B1 | 6/2001 | Khandros et al. | |
| 6,246,247 B1 | 6/2001 | Eldridge et al. | |
| 6,255,126 B1 | 7/2001 | Mathieu et al. | |
| 6,268,015 B1 | 7/2001 | Mathieu et al. | |
| 6,274,823 B1 | 8/2001 | Khandros et al. | |
| 6,275,043 B1 | 8/2001 | Muhlberger et al. | |
| 6,281,691 B1 | 8/2001 | Matsunaga et al. | |
| 6,286,208 B1 | 9/2001 | Shih et al. | |
| 6,295,729 B1 | 10/2001 | Beaman et al. | |
| 6,300,780 B1 | 10/2001 | Beaman et al. | |
| 6,307,161 B1 | 10/2001 | Grube et al. | |
| 6,310,483 B1 | 10/2001 | Taura et al. | |
| 6,329,827 B1 | 12/2001 | Beaman et al. | |
| 6,330,164 B1 | 12/2001 | Khandros et al. | |
| 6,332,270 B2 | 12/2001 | Beaman et al. | |
| 6,334,247 B1 | 1/2002 | Beaman et al. | |
| 6,339,338 B1 | 1/2002 | Eldridge et al. | |
| 6,384,614 B1 | 5/2002 | Hager et al. | |
| 6,388,455 B1 * | 5/2002 | Kamieniecki et al. | 324/752 |
| 6,400,168 B2 | 6/2002 | Matsunaga et al. | |
| 6,429,029 B1 | 8/2002 | Eldridge et al. | |
| 6,441,315 B1 | 8/2002 | Eldridge et al. | |
| 6,442,831 B1 | 9/2002 | Khandros et al. | |
| 6,448,865 B1 | 9/2002 | Miller | |
| 6,452,406 B1 | 9/2002 | Beaman et al. | |
| 6,452,411 B1 | 9/2002 | Miller et al. | |
| 6,456,099 B1 | 9/2002 | Eldridge et al. | |
| 6,456,103 B1 | 9/2002 | Eldridge et al. | |
| 6,459,343 B1 | 10/2002 | Miller | |
| 6,459,739 B1 | 10/2002 | Vitenberg | |
| 6,468,098 B1 | 10/2002 | Eldridge | |
| 6,475,822 B2 | 11/2002 | Eldridge | |
| 6,476,333 B1 | 11/2002 | Khandros et al. | |
| 6,476,630 B1 | 11/2002 | Whitten et al. | |
| 6,479,308 B1 | 11/2002 | Eldridge | |
| 6,480,978 B1 | 11/2002 | Roy et al. | |
| 6,482,013 B2 | 11/2002 | Eldridge et al. | |
| 6,491,968 B1 | 12/2002 | Mathieu et al. | |
| 6,499,121 B1 | 12/2002 | Roy et al. | |
| 6,501,343 B2 | 12/2002 | Miller | |
| 6,509,751 B1 | 1/2003 | Mathieu et al. | |
| 6,520,778 B1 | 2/2003 | Eldridge et al. | |
| 6,525,555 B1 | 2/2003 | Khandros et al. | |
| 6,526,655 B2 | 3/2003 | Beaman et al. | |
| 6,528,984 B2 | 3/2003 | Beaman et al. | |
| 6,534,856 B1 | 3/2003 | Dozier, II et al. | |
| 6,538,214 B2 | 3/2003 | Khandros | |
| 6,538,538 B2 | 3/2003 | Hreish et al. | |
| 6,539,531 B2 | 3/2003 | Miller et al. | |
| 6,549,106 B2 | 4/2003 | Martin | |
| 6,551,884 B2 | 4/2003 | Masuoka | |
| 6,559,671 B2 | 5/2003 | Miller et al. | |
| 6,597,187 B2 | 7/2003 | Eldridge et al. | |
| 6,603,323 B1 | 8/2003 | Miller et al. | |
| 6,603,324 B2 | 8/2003 | Eldridge et al. | |
| 6,605,941 B2 | 8/2003 | Abe | |
| 6,606,014 B2 | 8/2003 | Miller | |
| 6,606,575 B2 | 8/2003 | Miller | |
| 6,615,485 B2 | 9/2003 | Eldridge et al. | |

| | | | | | | |
|---|---|---|---|---|---|---|
| 6,616,966 B2 | 9/2003 | Mathieu et al. | | 6,882,546 B2 | 4/2005 | Miller |
| 6,621,260 B2 | 9/2003 | Eldridge et al. | | 6,887,723 B1 | 5/2005 | Ondricek et al. |
| 6,622,103 B1 | 9/2003 | Miller | | 6,888,362 B2 | 5/2005 | Eldridge et al. |
| 6,624,648 B2 | 9/2003 | Eldridge et al. | | 6,891,385 B2 | 5/2005 | Miller |
| 6,627,483 B2 | 9/2003 | Ondricek et al. | | 6,900,646 B2 | 5/2005 | Kasukabe et al. |
| 6,627,980 B2 | 9/2003 | Eldridge | | 6,900,647 B2 | 5/2005 | Yoshida et al. |
| 6,640,415 B2 | 11/2003 | Eslamy et al. | | 6,900,652 B2 | 5/2005 | Mazur |
| 6,640,432 B1 | 11/2003 | Mathieu et al. | | 6,900,653 B2 | 5/2005 | Yu et al. |
| 6,642,625 B2 | 11/2003 | Dozier, II et al. | | 6,902,941 B2 | 6/2005 | Sun |
| 6,644,982 B1 | 11/2003 | Ondricek et al. | | 6,903,563 B2 | 6/2005 | Yoshida et al. |
| 6,646,520 B2 | 11/2003 | Miller | | 6,910,268 B2 | 6/2005 | Miller |
| 6,655,023 B1 | 12/2003 | Eldridge et al. | | 6,911,814 B2 | 6/2005 | Miller et al. |
| 6,657,455 B2 | 12/2003 | Eldridge et al. | | 6,911,835 B2 | 6/2005 | Chraft et al. |
| 6,661,316 B2 | 12/2003 | Hreish et al. | | 6,913,468 B2 | 7/2005 | Dozier, II et al. |
| 6,664,628 B2 | 12/2003 | Khandros et al. | | 6,917,210 B2 | 7/2005 | Miller |
| 6,669,489 B1 | 12/2003 | Dozier, II et al. | | 6,949,942 B2 * | 9/2005 | Eldridge et al. ............ 324/765 |
| 6,672,875 B1 | 1/2004 | Mathieu et al. | | 7,001,785 B1 | 2/2006 | Chen |
| 6,677,744 B1 | 1/2004 | Long | | 7,002,133 B2 | 2/2006 | Beausoleil et al. |
| 6,678,850 B2 | 1/2004 | Roy et al. | | 7,002,363 B2 | 2/2006 | Mathieu |
| 6,678,876 B2 | 1/2004 | Stevens et al. | | 7,002,364 B2 | 2/2006 | Kang et al. |
| 6,680,659 B2 | 1/2004 | Miller | | 7,003,184 B2 | 2/2006 | Ronnekleiv et al. |
| 6,685,817 B1 | 2/2004 | Mathieu | | 7,005,842 B2 | 2/2006 | Fink et al. |
| 6,686,754 B2 | 2/2004 | Miller | | 7,005,868 B2 | 2/2006 | McTigue |
| 6,690,185 B1 | 2/2004 | Khandros et al. | | 7,005,879 B1 | 2/2006 | Robertazzi |
| 6,701,612 B2 | 3/2004 | Khandros et al. | | 7,006,046 B2 | 2/2006 | Aisenbrey |
| 6,708,403 B2 | 3/2004 | Beaman et al. | | 7,007,380 B2 | 3/2006 | Das et al. |
| 6,713,374 B2 | 3/2004 | Eldridge et al. | | 7,009,188 B2 | 3/2006 | Wang |
| 6,714,828 B2 | 3/2004 | Eldridge et al. | | 7,009,383 B2 | 3/2006 | Harwood et al. |
| 6,720,501 B1 | 4/2004 | Henson | | 7,009,415 B2 | 3/2006 | Kobayashi et al. |
| 6,722,032 B2 | 4/2004 | Beaman et al. | | 7,011,531 B2 | 3/2006 | Egitto et al. |
| 6,724,205 B1 | 4/2004 | Hayden et al. | | 7,012,425 B2 | 3/2006 | Shoji |
| 6,727,579 B1 | 4/2004 | Eldridge et al. | | 7,012,441 B2 | 3/2006 | Chou et al. |
| 6,727,580 B1 | 4/2004 | Eldridge et al. | | 7,013,221 B1 | 3/2006 | Friend et al. |
| 6,727,716 B1 | 4/2004 | Sharif | | 7,014,499 B2 | 3/2006 | Yoon |
| 6,729,019 B2 | 5/2004 | Grube et al. | | 7,015,455 B2 | 3/2006 | Mitsuoka et al. |
| 6,741,085 B1 | 5/2004 | Khandros et al. | | 7,015,689 B2 | 3/2006 | Kasajima et al. |
| 6,741,092 B2 | 5/2004 | Eldridge et al. | | 7,015,690 B2 | 3/2006 | Wang et al. |
| 6,759,311 B2 | 7/2004 | Eldridge et al. | | 7,015,703 B2 | 3/2006 | Hopkins et al. |
| 6,764,869 B2 | 7/2004 | Eldridge | | 7,015,707 B2 | 3/2006 | Cherian |
| 6,777,319 B2 | 8/2004 | Grube et al. | | 7,015,708 B2 | 3/2006 | Beckous et al. |
| 6,778,406 B2 | 8/2004 | Grube et al. | | 7,015,709 B2 | 3/2006 | Capps et al. |
| 6,780,001 B2 | 8/2004 | Eldridge et al. | | 7,015,710 B2 | 3/2006 | Yoshida et al. |
| 6,784,674 B2 | 8/2004 | Miller | | 7,015,711 B2 | 3/2006 | Rothaug et al. |
| 6,784,677 B2 | 8/2004 | Miller et al. | | 7,019,541 B2 | 3/2006 | Kittrell |
| 6,784,679 B2 | 8/2004 | Sweet et al. | | 7,019,544 B1 | 3/2006 | Jacobs et al. |
| 6,788,094 B2 | 9/2004 | Khandros et al. | | 7,020,360 B2 | 3/2006 | Satomura et al. |
| 6,791,176 B2 | 9/2004 | Mathieu et al. | | 7,020,363 B2 | 3/2006 | Johannessen |
| 6,798,225 B2 | 9/2004 | Miller | | 7,022,976 B1 | 4/2006 | Santana, Jr. et al. |
| 6,806,724 B2 | 10/2004 | Hayden et al. | | 7,022,985 B2 | 4/2006 | Knebel et al. |
| 6,807,734 B2 | 10/2004 | Eldridge et al. | | 7,023,225 B2 | 4/2006 | Blackwood |
| 6,811,406 B2 | 11/2004 | Grube | | 7,023,226 B2 | 4/2006 | Okumura et al. |
| 6,812,691 B2 | 11/2004 | Miller | | 7,023,231 B2 | 4/2006 | Howland, Jr. et al. |
| 6,815,963 B2 | 11/2004 | Gleason et al. | | 7,025,628 B2 | 4/2006 | LaMeres et al. |
| 6,816,031 B1 | 11/2004 | Miller | | 7,026,832 B2 | 4/2006 | Chaya et al. |
| 6,817,052 B2 | 11/2004 | Grube | | 7,026,833 B2 | 4/2006 | Rincon et al. |
| 6,818,840 B2 | 11/2004 | Khandros | | 7,026,834 B2 | 4/2006 | Hwang |
| 6,822,529 B2 | 11/2004 | Miller | | 7,026,835 B2 | 4/2006 | Farnworth et al. |
| 6,825,052 B2 | 11/2004 | Eldridge et al. | | 7,030,599 B2 | 4/2006 | Douglas |
| 6,825,422 B2 | 11/2004 | Eldridge et al. | | 7,032,307 B2 | 4/2006 | Matsunaga et al. |
| 6,827,584 B2 | 12/2004 | Mathieu et al. | | 7,034,553 B2 | 4/2006 | Gilboe |
| 6,835,898 B2 | 12/2004 | Eldridge et al. | | 7,035,738 B2 | 4/2006 | Matsumoto et al. |
| 6,836,962 B2 | 1/2005 | Khandros et al. | | 2005/0062533 A1 | 3/2005 | Vice |
| 6,839,964 B2 | 1/2005 | Henson | | 2005/0151548 A1 | 7/2005 | Hayden et al. |
| 6,845,491 B2 | 1/2005 | Miller et al. | | | | |
| 6,856,150 B2 | 2/2005 | Sporck et al. | | FOREIGN PATENT DOCUMENTS | | |
| 6,862,727 B2 | 3/2005 | Stevens | | EP | 945736 (A3) | 9/1999 |
| 6,864,105 B2 | 3/2005 | Grube et al. | | JP | 55115383 A2 | 9/1980 |
| 6,864,694 B2 | 3/2005 | McTigue | | JP | 570575480 | 5/1982 |
| 6,870,381 B2 | 3/2005 | Grube | | JP | 62239050 | 10/1987 |
| 6,882,239 B2 | 4/2005 | Miller | | JP | 7012871 | 1/1995 |

PROBE FOR COMBINED SIGNALS

CROSS-REFERENCE TO RELATED APPLICATIONS

This is a continuation of application Ser. No. 11/077,810, U.S. Pat. No. (7,075,320) filed Mar. 9, 2005; which is a continuation of application Ser. No. 10/928,688, U.S. Pat. No. (7,046,023) filed Aug. 26, 2004; which is a continuation of application Ser. No. 10/712,579, U.S. Pat. No. (6,806,724) filed Nov. 12, 2003, now U.S. Pat. No. 6,806,724 B2; which is a division of application Ser. No. 10/294,130 U.S. Pat. No. (6,724,205), filed Nov. 13, 2002, now U.S. Pat. No. 6,724,205 B1.

BACKGROUND OF THE INVENTION

The present invention relates to probe measurement systems for measuring the electrical characteristics of integrated circuits and other microelectronic devices tested by simultaneously applying a direct current and a modulation signal to the device-under-test.

There are many types of probing assemblies that have been developed for measuring the characteristics of integrated circuits and other forms of microelectronic devices. One representative type of assembly uses a circuit card on which are formed elongate conductive traces that serve as signal and ground lines. A central opening is formed in the card, and a needle-like probe tip is attached to the end of each trace adjacent the opening so that a radially extending array of downwardly converging needle-like tips is presented by the assembly for selective connection with the closely spaced contact pads of the microelectronic device being tested. A probe assembly of this type is shown, for example, in Harmon U.S. Pat. No. 3,445,770. This type of probing assembly, however, is unsuitable for use at higher frequencies, including microwave frequencies in the gigahertz range, because at such frequencies the needle-like tips act as inductive elements and because there are no adjoining elements present to suitably counteract this inductance with a capacitive effect in a manner that would create a broadband characteristic of more or less resistive effect. Accordingly, a probing assembly of the type just described is unsuitable for use at microwave frequencies due to the high levels of signal reflection and substantial inductive losses that occur at the needle-like probe tips.

One type of probing assembly that is capable of providing a controlled-impedance low-loss path between its input terminal and the probe tips is illustrated in Godshalk et al., U.S. Pat. No. 5,506,515. The probe has a tip assembly including a semi-rigid coaxial cable with a Teflon™ dielectric and a freely-suspended end. An inner finger and an outer pair of fingers are mounted on the freely-suspended end of the cable. Each of the fingers is made of resilient conductive material, so as to form a coplanar transmission line. Cantilevered portions of the fingers extend past the end of the cable to form an air-dielectric transmission path of uniform and stable characteristics despite exposure to numerous contact cycles. The fingers provide a suitable means for probing nonplanar wafer contact pads while promoting good visibility in the area of the contact pads. The characteristic impedance of typical microwave probes and cables is approximately 50 ohms closely matching the impedance of the typical microwave device-under-test (DUT) so broadband signals can travel through the probe with minimal loss.

However, when testing certain devices, such as laser diodes, the use of a typical microwave probe is problematic. Laser diode testing requires simultaneous application of a modulation signal and a DC electrical current to a contact pad of the device to generate a modulated light output. For testing, the modulation signal is typically a swept frequency sinusoid (AC) or a wide bandwidth pulsed waveform. The DC and modulation signals are superimposed and the combined signals are conducted to a contact tip of a probe in selective engagement with the contact pad of the DUT. Typically, the impedance seen by the modulation signal, the dynamic resistance of an active laser diode, for example, is on the order of five ohms. As a result, there is a significant impedance mismatch with the typical microwave probe and cable and the mismatched impedance distorts the modulation signal measured by the test instrumentation. While some instrumentation, such as a Vector Network Analyzer (VNA), can be calibrated to correct for distortion, the distortion can substantially affect measurements made with other instrumentation. Further, the distortion can have a magnitude sufficient to attenuate the modulation signal at some frequencies, causing a loss of dynamic range and accuracy for the measurements, even when made with a VNA.

To improve the impedance matching and reduce distortion of the modulation signal, an impedance matching resistor can be installed in series with the contact tip of a microwave probe. For testing laser diodes, the typical series impedance matching resistor has a value of 45 ohms, which in series with the five ohm dynamic resistance of a typical laser diode, provides a satisfactory impedance match with the probes and cables (≈50 ohms) to substantially reduce distortion of the test signals. Resistors with other values can be incorporated into the probe to match impedance when testing other types of devices. However, since the modulation signal and the DC current are superimposed on the same conductor, both signals must pass through the series impedance-matching resistor which dissipates power equal to the product of the resistance and the square of the current. For DUTs requiring higher current levels, the power that must be dissipated by the resistor is substantial. On the other hand, to pass high frequency signals, the resistor must small in size and the distance between the resistor and the contact tip must be short to minimize parasitic series inductance and shunt capacitance. The performance of a probe with a series impedance matching resistor is compromised by the competing necessities of sufficient resistance to match the impedance of the probe and cables and minimized resistance to minimize the voltage drop and the power dissipated by the resistor.

What is desired, therefore, is a probing system and method having minimal resistance to minimize voltage drop and power dissipation combined with adequate resistance to match the impedance of the probe and cables to minimize modulation signal distortion when a direct current and a modulated signal are simultaneously applied to a DUT.

DETAILED DESCRIPTION OF THE INVENTION

Figure 1:
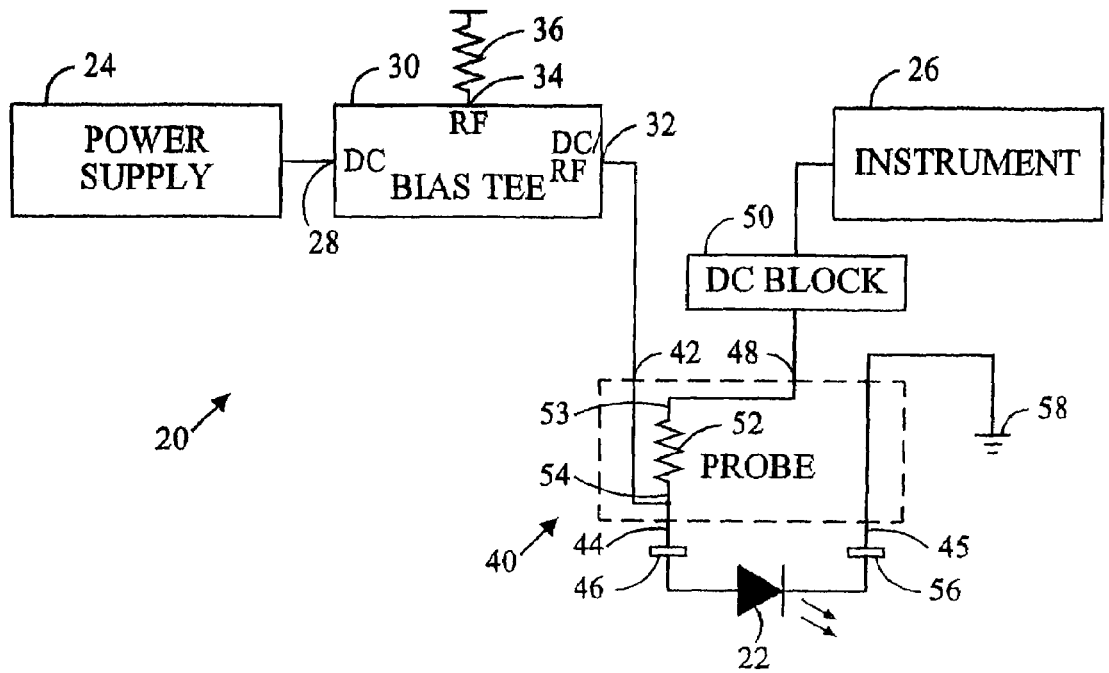
FIG. 1 is a schematic illustration of a first embodiment of a combined signal probing system.

On-wafer testing of certain devices requires the simultaneous application of direct current and a modulated signal to conductive contact pads on the wafer that correspond to the device-under-test (DUT). For example, to test a laser diode on a wafer, a DC current and a modulation signal are simultaneously applied to a contact pad for the diode. The DC current provides the power for generating light and the modulation signal varies lasing intensity to produce a modulated light output. For testing, the modulation signal is typically a swept frequency sinusoid (AC) or a wide bandwidth pulsed waveform. When testing a laser diode, the dynamic resistance of the operating diode which is typically on the order of five ohms is the impedance seen by the modulation signal. On the other hand, the typical microwave probe and cable has an impedance of approximately 50 ohms. As a result of the significant impedance mismatch, the modulation signal will be distorted. Some test instrumentation, such as a Vector Network Analyzer (VNA), can compensate for some signal distortion, but distortion compensation is not possible with other instrumentation. Further, the distortion may cause attenuation of the signal at certain frequencies adversely affecting the dynamic range and accuracy of measurements even when performed with a VNA.

To improve the impedance matching and reduce distortion of the modulation signal, a resistor can be incorporated into the tip of the probe. For example, an impedance matching resistor with a value of 45 ohms in series with the five ohm dynamic resistance of a typical operating laser diode provides a satisfactory impedance match with typical microwave probes and cables and substantially reduces signal distortion. However, since the modulation signal and the DC current are superimposed on the same conductor, both signals must pass through the series impedance-matching resistor resulting in a voltage drop and dissipation of power substantially equal to the product of the resistance and the square of the DC current. For devices requiring high current levels, the power that is dissipated by the resistor is substantial. However, to minimize parasitic series inductance and shunt capacitance of the probe, the size of the resistor must be minimized, limiting its capacity to dissipate power. Probe performance must be compromised to satisfy the competing requirements imposed on the impedance-matching resistor. Decreasing the resistance reduces the amount of power that is dissipated by the resistor but increases the impedance mismatch and the signal distortion. On the other hand, increasing the size of the resistor increases its capacity to dissipate power but also increases its inductance and capacitance and, consequently, the distortion of the modulation signal. The present inventor concluded that the performance of a probe applying a combined DC current and modulation signal to a DUT could be improved if the signal paths could be separated so that the modulated signal was transmitted over a signal path having a matched impedance while the DC current flow was transmitted over a signal path with minimal resistance to minimize loss and power dissipation.

Referring in detail to the drawings wherein similar parts of the invention are identified by like reference numerals, and more particularly to FIG. 1, an on-wafer probing system 20 for testing a DUT 22 (for example, a laser diode) requiring simultaneous application of DC current and a modulated signal includes a DC power supply 24 and a high speed test instrument 26 such as a VNA or a Bit-Error-Rate tester supplying a modulation signal. The DC power supply 24 is connected to the DC port 28 of a bias-tee 30. A bias tee 30 is a device used to superimpose a direct current and a modulation signal or for extracting a direct current component from a combined signal without affecting the high frequency component of the signal. The combined DC/RF port 32 of the bias tee 30 is connected to a first input port 42 of the combined signal probe 40. The modulated signal or radio frequency (RF) port 34 of the bias tee 30 is connected to a termination resistor 36 to provide an impedance matched termination for the modulation signal imposed on the conductor connecting the bias tee and the combined signal probe. The first input port 42 of the combined signal probe 40 is conductively connected to a signal contact tip 44 that is arranged to selectively engage a signal contact pad 46 of the DUT 22 (a laser diode).

On the other hand, the modulation signal, generated by the instrumentation 26 of the probing system 20, is transmitted to a DC block 50. The DC block 50 comprises, generally, series capacitance that blocks the flow of DC current into the instrumentation 26 over the conductor that connects the instrumentation 26 to the combined signal probe 40. From the DC block 50 the modulation signal is transmitted to the second input port 48 of the combined signal probe 40 which is conductively connected to a first port 53 of an impedance-matching resistor 52. The second port 54 of the impedance matching resistor 52 is conductively connected to the signal contact tip 44 of the probe. A second contact pad 56 of the DUT 22 is grounded 58 through a ground contact tip 45 of the combined signal probe 40. The signal contact tip 44 and the ground contact tip 45 are arranged to simultaneously selectively engage, respectively, the signal contact pad 46 and the ground contact pad 56 of the DUT 22.

In the probing system 20, the modulation signal sees a termination comprising the impedance-matching resistor 52 in series with the parallel combination of the dynamic resistance of the DUT and the impedance seen looking from the first input port 42 back toward the bias tee 30. If the termination resistor 34 has a resistance matching the impedance of the connection between the bias tee 30 and the combined signal probe 40 then the impedance at the DUT is equal to the impedance of the connection between the bias tee and the combined signal probe. Typically, the connection between the bias tee 30 and the combined signal probe 40 comprises coaxial cable with an impedance of approximately 50 ohms. Since the impedance of the DUT is typically substantially less (typically, five ohms for a laser diode) than the impedance looking into the coaxial cable connection toward the bias tee 30, the parallel combination of impedances is dominated by the smaller impedance and the modulation signal path is approximately match terminated, minimizing distortion of the modulation signal. On the other hand, the signal path of the DC current powering the DUT does not pass through the impedance-matching resistor 52 so losses in the impedance-matching resistor are minimized. The probing system 20 permits a modulation signal to be transmitted to the DUT 22 over a first signal path that includes an impedance matching resistor 52 while a direct current is simultaneously transmitted to the DUT over a second signal path that does not traverse the impedance matching resistor.

Figure 2:
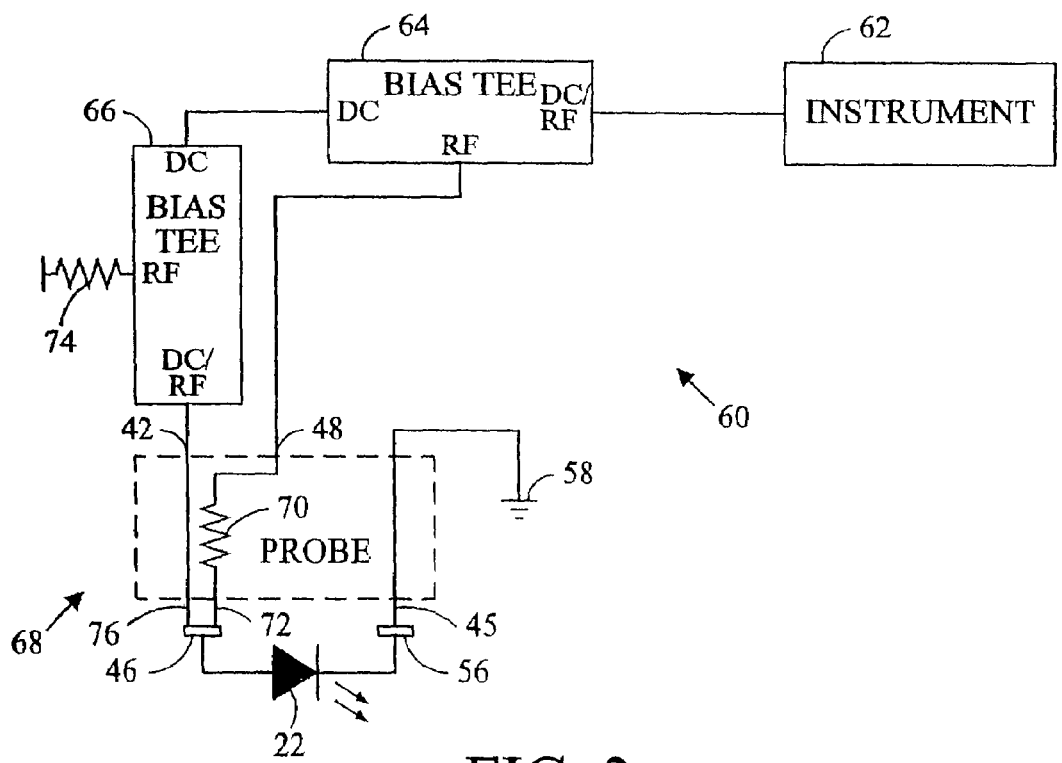
FIG. 2 is a schematic illustration of a second embodiment of a combined signal probing system.
Figure 3:
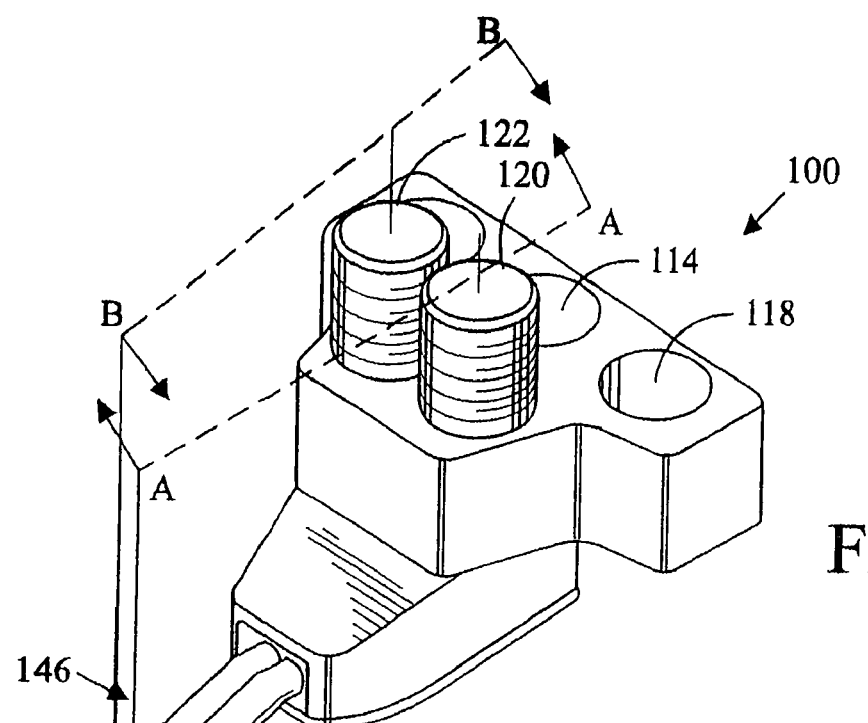
FIG. 3 is a perspective view of a first embodiment of a combined signal probe.

Referring to FIG. 2, in a second embodiment of the probing system 60, the instrumentation 62 is the source of an offset modulation signal. The combined DC current and modulation signal are transmitted to a combined signal port of a first bias tee 64. In the first bias tee 64, the DC current and modulation signal components are separated. The modulation signal is transmitted to the first input port 48 of the combined signal probe 68 which is conductively connected to the first port of an impedance matching resistor 70. The second port of the impedance matching resistor 70 of the probe 68 is connected to a modulation signal contact tip 72 arranged to selectively engage the signal contact pad 46 of the DUT 22.

The DC current is transmitted from the first bias tee 64 to a second bias tee 66. The combined signal (DC/RF) port of the second bias tee 66 is connected to the second input port of the probe 42 which is conductively connected to a DC signal probe 76 arranged to engage the signal contact pad 46 of the DUT 22 when the modulation signal probe 72 is in engagement with the signal contact pad. An impedance matched termination for the modulation signal imposed on the conductor connecting the second bias tee 66 to the DC signal probe 76 is provided by a termination resistor 74 connected to the RF port of the second bias tee 66. As in the first embodiment, the modulation signal is applied to the signal contact pad 46 of the DUT 22 over a distortion minimizing impedance matched signal path while the DC current is simultaneously applied to the signal contact pad over a signal path that does not include the impedance matching resistor and, therefore, minimizes power dissipation.

Figure 9:
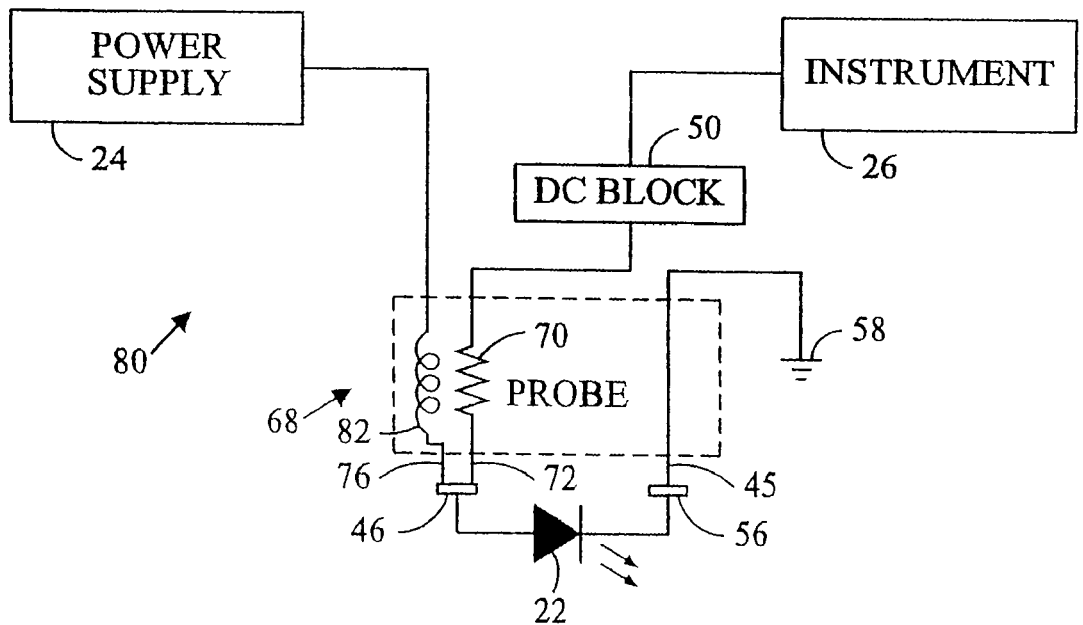
FIG. 9 is a schematic illustration of a third embodiment of a combined signal probing system.

Referring to FIG. 9, in still another embodiment of the probing system 80, the DC current is generated by a power supply 24 and transmitted to the DC signal contact tip 76 of the combined signal probe 68 over a signal path including inductance represented by the inductor 82. The modulation signal, generated by the instrumentation 26, is transmitted through the DC block 50 to the first input port 48 of the combined signal probe 68 which is conductively connected to the first port of the impedance matching resistor 70. The second port of the impedance matching resistor 70 is conductively connected to the modulation signal contact tip 72 which is arranged to engage the signal contact pad 46 of the DUT 22 when the DC signal contact tip 76 is in contact with the contact pad. The flow of DC current toward the instrumentation 26 is blocked by the capacitance of the DC block 50. At the frequency of the modulation signal, the impedance presented by the inductance 82 is substantially greater than impedance of the DUT, substantially blocking the passage of the modulation signal toward the power supply while permitting the DC current to flow, substantially unimpeded, to the combined signal probe 68 over a signal path that bypasses the impedance matching resistor 70. Distortion of the modulation signal is minimized by the impedance matching in the modulation signal path while power loss is minimized by avoiding the flow of current through the impedance matching resistor 70.

Referring to FIGS. 3, 4, 5, and 6, an exemplary first embodiment of a combined signal wafer probe 100 constructed in accordance with the present invention is designed to be mounted on a probe-supporting member 102 of a wafer probe station so as to be in suitable position for probing a DUT, such as an individual laser diode component on a wafer 104. In this type of application, the DUT is typically supported under vacuum pressure on the upper surface of a chuck 106 that is part of the probing station. Ordinarily an X-Y-Z positioning mechanism is provided, such as a micrometer knob assembly, to effect movement between the supporting member and the chuck so that the tip assembly 110 of the probe can be brought into pressing engagement with contact pads 108 on the DUT that correspond to the particular component requiring measurement.

With respect to its overall construction, the wafer probe 100 includes a primary support block 112 which, in the illustrated embodiment, is made of brass and which is suitably constructed for connection to the probe-supporting member 102. To effect this connection, a round opening 114 that is formed on the block is snugly fitted slidably onto an alignment pin (not shown) that upwardly projects from the probe-supporting member, and a pair of fastening screws 116 are inserted into a corresponding pair of countersunk openings 118 provided on the block for screwing engagement with the probe-supporting member, each within a respective threaded opening formed on that member.

As illustrated in FIG. 1, the first embodiment of the exemplary combined signal wafer probe 100 includes a first input port 120 and a second input port 122 which, in the preferred embodiment depicted, comprise spark-plug type, K-connectors. This connector enables the external connection of an ordinary coaxial cable to the input ports 120, 122 of the wafer probe. The connection of a coaxial cable to the first input port 120 permits a well-shielded high frequency transmission channel to be established between the probe and an attached measuring instrument 26. Likewise, a shielded high frequency transmission channel between the bias tee 66 and the combined signal wafer probe 100 is established by connecting a coaxial cable between the second input port 122 of the probe and the combined (DC/RF) port of the bias tee. If desired, other types of connectors can be used such as a 2.4 mm connector, a 1.85 mm connector or a 1 mm connector. The combined signal wafer probe 100 provides low-loss transmission paths having a controlled impedance characteristic from the input ports 120, 122 down to the contact tip assembly 110. The tip assembly 110 of the wafer probe is of particularly rugged construction and able to withstand in excess of 500,000 separate contact cycles without maintenance or repair. At the same time, the tip assembly is able to readily adapt to non-planar contact pad surfaces of a DUT on a wafer 104.

Figure 4:
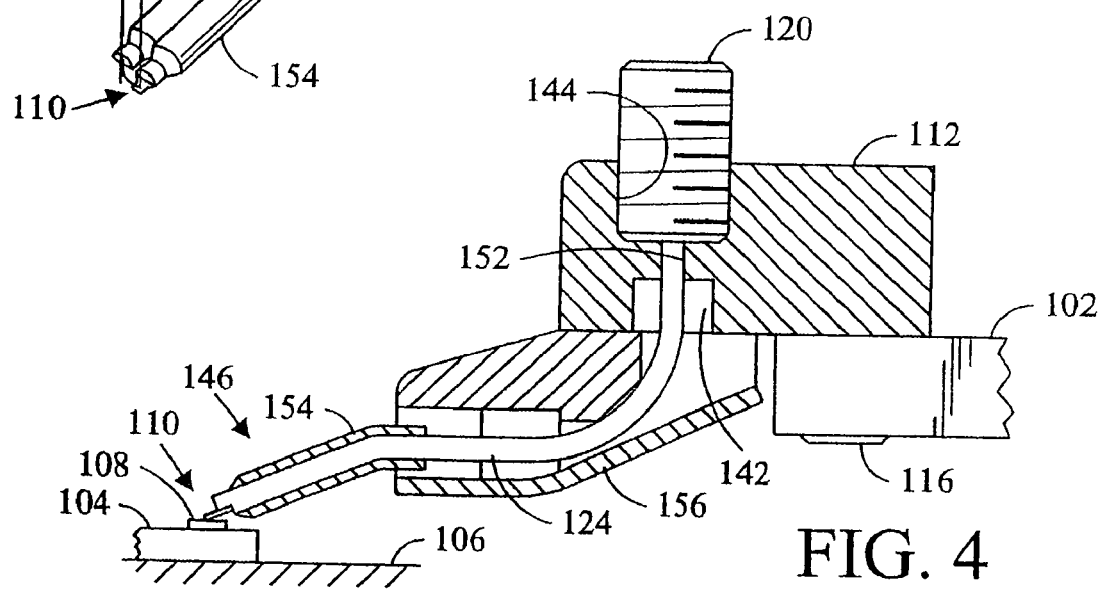
FIG. 4 is a section view of the combined signal probe of FIG. 3 taken along line A—A just after contact has been made between the probe tip and a contact pad of a device-under-test.
Figure 6:
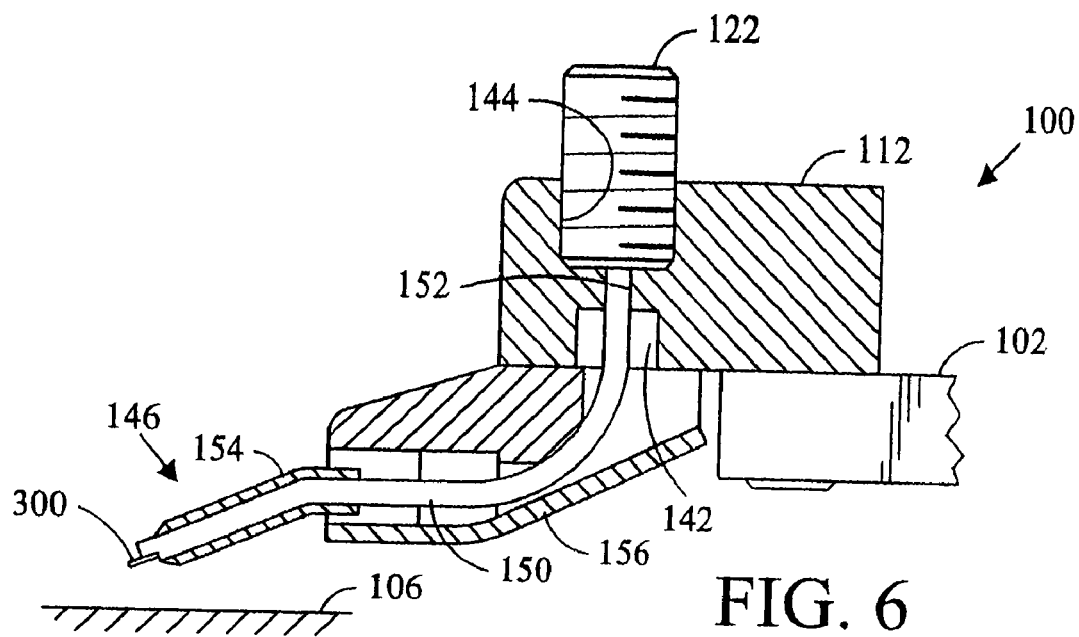
FIG. 6 is a section view of the combined signal probe of FIG. 3 taken along line B—B.
Figure 7:
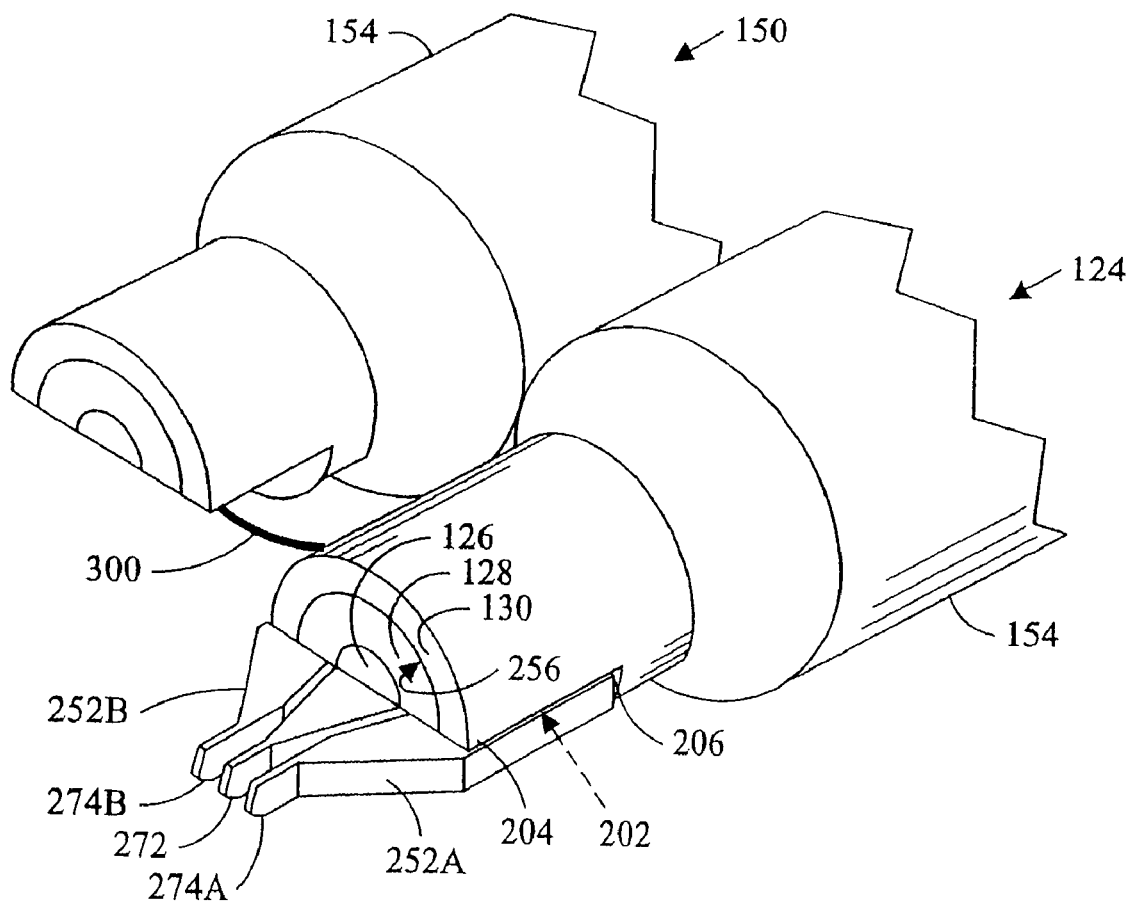
FIG. 7 is an enlarged perspective view of the probe tip of the combined signal probe of FIG. 3.

In the preferred embodiment shown in FIG. 4, a semirigid coaxial cable 124 is electrically connected at its rearward end to the K-connector of the first input port 120. Referring also to FIG. 7, this coaxial cable 124 includes an inner conductor 126, an inner dielectric 128 and an outer conductor 130 and is preferably of phase-stable, low-loss type. Similarly, as illustrated in FIG. 6, a semirigid coaxial cable 150 is connected at its rearward end to the K-connector at the second input port 122.

To prepare the rearward ends of the cables 124, 150 for connection to the appropriate K-connector, the rearward end is stripped to expose the inner conductor, and this inner conductor is temporarily held inside a dummy connector while the adjacent outer conductor is soldered within a bore 140, 152 formed in the primary support block 112. A recess 142 that is formed in the block below this bore provides access to facilitate the soldering process. The dummy connector is then removed and the K-connectors are screwably installed in threaded openings 144 formed on the block above the bore so as to effect electrical connection between the connectors and the coaxial cables 124, 150. A thread locking compound may be applied to the threads of the K-connectors prior to their installation to ensure a tight physical connection.

Figure 5:
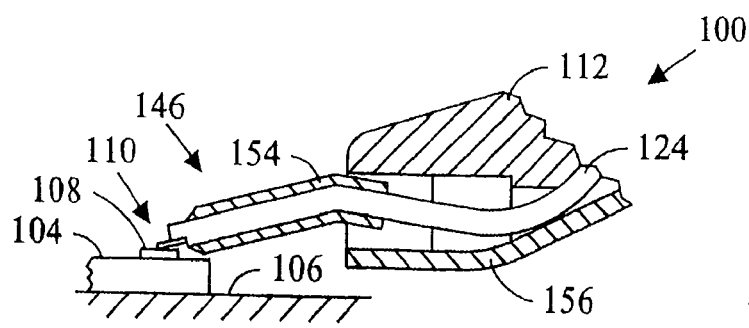
FIG. 5 is a fragmentary view corresponding to FIG. 4 showing how the probe tip moves in relation to the body of the probe in response to a downward shift of the body in relation to the DUT.

Referring to FIGS. 4 and 5 together, the forward end 146 of the cable 124 remains freely suspended and, in this condition, serves as a movable support for the probing end 110 of the probe. Before being connected to the K-connector of the first input port 120, the cable 124 is bent along first and second intermediate portions in the manner shown in FIG. 4 so that an upwardly curving 90° bend and a downwardly curving 23° bend, respectively, are formed in the cable. A tube 154 of semi-flexible microwave-absorbing material is slidably inserted over the protruding end of the coaxial cable 124. One material used for forming the tube is comprises iron and urethane. The bottom of the rigid support block 112 is covered with a soft and flexible sheet 156 formed of microwave-absorbing material so as to provide a cushioning layer along the bottom of that block. An example of material of suitable type for this purpose is a filled silicon rubber containing iron. The microwave-absorbing components on the exemplary probe, that is, the rigid support block 112, the flexible sheet 156 and the semi-flexible tube 154, cooperatively serve to substantially reduce the levels of microwave energy that travel along the outer conductor 130 of the semirigid cable 124 and other exterior probe structures.

As illustrated in FIG. 4, the combined signal probe 100 is positioned so that the probe tip 110 is brought into contact with the contact pad 108 of the DUT. After probe tip 110 is brought into pressing engagement with its corresponding contact pad the vertical spacing between the probe 100 and the device-under-test is then reduced even further, as depicted in FIG. 5, causing the coaxial cable 124 to bend and causing the contact tip to wipe across the surface of the corresponding contact pad 108, as indicated.

Prior to its connection to the K-connector of the input port 120, a semicylindrical recess 202 is formed in each of the cables 124, 150 adjacent their forward ends as shown in FIG. 7. This recess is formed by making a longitudinal cut through the cable and by making a transverse cut at the end of the longitudinal cut. In accordance with this procedure, a semicylindrical portion of the outer conductor 130, the inner dielectric 128, and the inner conductor 126 are removed, as so that the remaining portions of these elements together form a flat shelf 204 that extends to the forward end of the cable as well as a back face 206 that extends crosswise in relation to the length of the cable.

Figure 8:
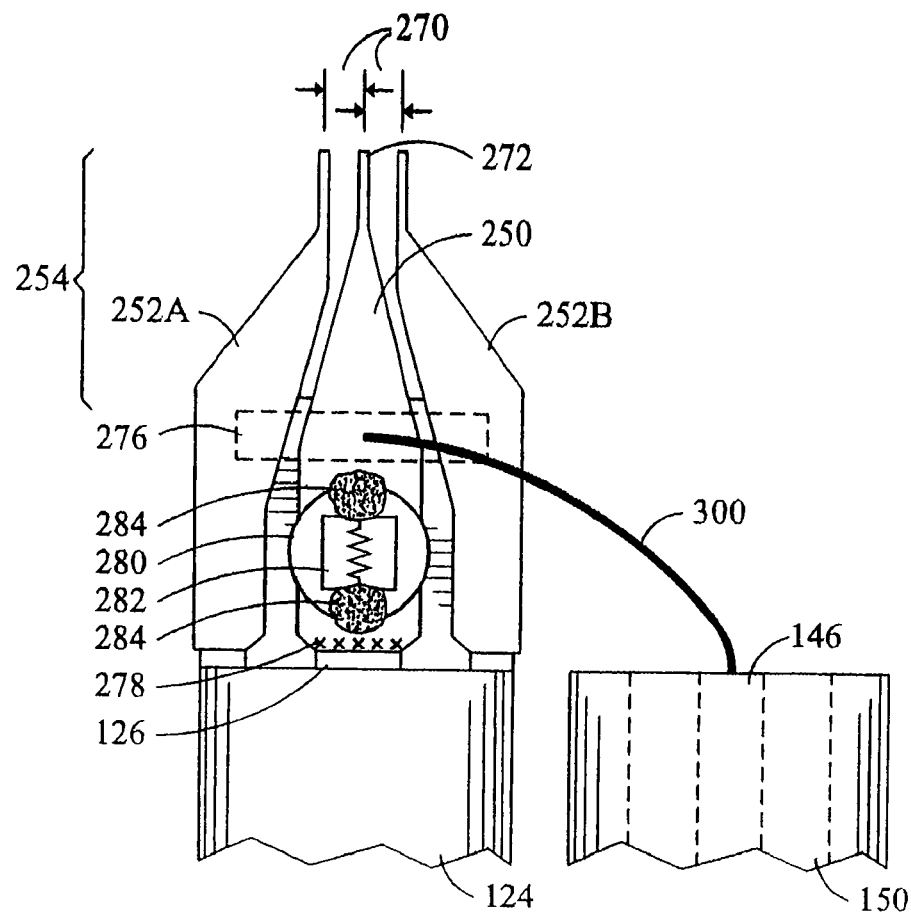
FIG. 8 is a bottom view of the probe tip of FIG. 7.

Referring to FIGS. 7 and 8, at the probing end of the exemplary probe, an inner conductive finger 250 is connected to the inner conductor 126 of the cable 124 and a pair of outer conductive fingers 252a, 252b are conductively connected to the adjacent outer conductor 130 so as to form a signal-ground conductor configuration. While the exemplary probe tip includes a pair of outer conductive fingers, the probe tip can be constructed with a single outer finger. Referring also to FIG. 8, which shows a bottom view of the probing end 146, each respective finger includes a cantilevered portion 254 that extends past the forward end 256 of the cable 124. The cantilevered portions 254 are arranged in transversely spaced apart relationship to each other so as to cooperatively form a controlled impedance transmission line in order that a low-loss transition can be made between the respective conductors 130 and 126 of the cable 124 and the respective pads on the device-under-test.

To a certain extent, the spacing between the respective fingers 252a, 252b, and 250 is determined by the geometry of the device contact pads and the cable. For example, in relation to the distal ends of the respective fingers, the pitch or centerline-to-centerline spacing 270 between adjacent pairs of the fingers is selected in order to match the pitch 270 of the contact pads on the device-under-test. The distal ends of the pair of fingers may be set apart at a pitch of 6 mils in order to match the 6 mil pitch of 2 mil square contact pads on a device-under-test. (It is also customary for the pad-to-pad pitch to be set at other values such as 4, 5, 8 or 10 mils). On the other hand, proximate the back face 204 of the cable 124, the pitch between adjacent fingers is selected to correspond with the pitch between the exposed face of the inner conductor 126 and the adjacent exposed face of the outer conductor 130 of the cable 124.

Aside from the dimensions just mentioned, the principal criteria used in selecting the respective dimensions and relative spacing of the fingers 250, 252a, 252b is the desired establishment of a low-loss transmission line between the respective conductors 126 and 130 of the cable and the respective pads on the DUT.

The distal end 272 of the central finger 250 comprises the signal contact tip 44 and the distal ends of the outer fingers 252a, 252b are connected to ground through the outer conductor 130 of the coaxial cable 124. The three fingers are attached to the cable near the end of the cable 124 by a non-conductive adhesive 276, such as an epoxy adhesive. At the end of the fingers remote from the contact tips, the center finger 250 is affixed to the center conductor 126 and the outer contact tips 252a, 252b are affixed to the outer conductor 130 of the coaxial cable. Referring to FIG. 8, to incorporate an impedance matching resistor 52 in series between the center conductor 126 of the coaxial cable 124 and the signal contact tip 44, an aperture 280 is drilled in the body of the central finger 252 at a position between the soldered connection 278 and the non-conductive attachment 276 of the center finger to the cable. The aperture 280 is of such size and depth as to sever the center finger 250 and the center conductor 126 of the cable 124. A resistor 282 deposited on a ceramic substrate is inserted into the aperture and bonded in the aperture 280. A conductive adhesive 284 connects the forward portion of the center finger 250 to the rearward portion which is soldered to the center conductor 126.

As illustrated in FIG. 6, the coaxial cable 150 connected to the second input port 122 of the combined signal probe 100 follows a path through the probe substantially paralleling that of the coaxial cable 124 connected to the first input port 120. The coaxial cable 150 from the second input port 122 terminates adjacent to the probe end of the coaxial cable 124. A jumper 300 is affixed to the center conductor 302 of the coaxial cable 150 and to the center finger 250 projecting from the coaxial cable 124. As a result, DC current from the power supply 24 transmitted through the second input port 124 of the combined signal probe 100 is conducted directly to the signal contact tip 44 at the end 272 the center finger 250 over a signal path that does not pass through the impedance matching resistor 52.

Figure 10:
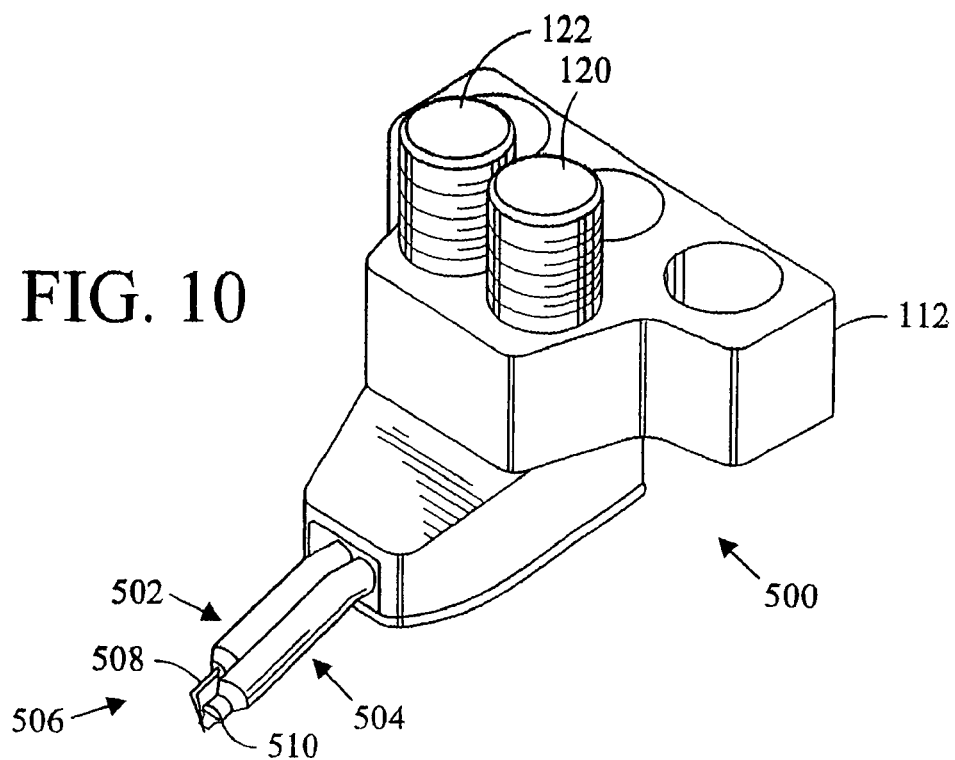
FIG. 10 is a perspective view of a second embodiment of a combined signal probe having separated direct current and modulation signal contact tips.
Figure 11:
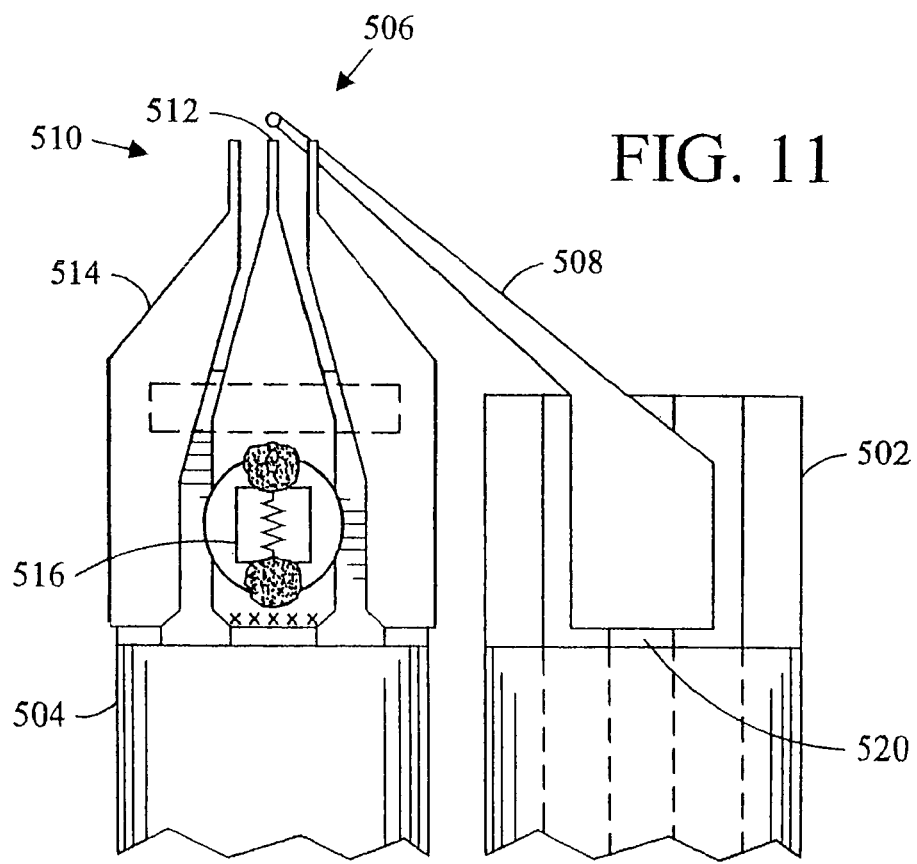
FIG. 11 is a bottom view of the probe tip of the probe of FIG. 10 having separated contact tips.

Referring to FIG. 10, a second embodiment of the combined signal probe 500 comprises, generally, the primary support block 112 for mounting the probe and the K-connectors of the input ports 120, 122 and supporting coaxial cables 502, 504 connecting the input ports and the probe's tip assembly 506. The tip assembly 506 comprises individual contact tip assemblies for each the direct current 508 and the modulation signal 510 signal paths. Referring to FIG. 11, the contact tip assembly for the modulation signal 510 comprises a modulation signal tip 512 and at least one ground contact tip 514 arranged to simultaneously engage the DUT's signal and ground contact pads, respectively. The impedance matching resistor 516 connects the modulation signal contact tip 512 to the modulation signal path at the center conductor of the coaxial cable 504. The direct current tip assembly 508 comprises a contact tip connected to the center conductor 520 of the coaxial cable 502 which provides the signal path for the direct current. The direct current contact tip 508 is arranged to contact the signal contact pad of the DUT when the modulation signal contact tip 510 and the ground signal contact tips 514 are brought into engagement with the signal and ground contact pads of the DUT. The direct current contact tip 508 may have a needle-like structure to provide an inductive element 82 that passes the direct current with minimal resistance but exhibits a high impedance to signals at the frequency of the modulation signal.

The combined signal probe, probe system, and the method of probing permits a DC current and a modulation signal to be transmitted in parallel for combination at the probe signal contact tip so that impedance matching can be applied to the modulation signal path to reduce signal distortion while resistance is minimized in the path of the DC signal to minimize voltage drop and power dissipation.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A probing system for interconnecting a source of a modulated signal and a source of a direct current to a terminal of a device under test having a device impedance, said probing system comprising:
   (a) a capacitor;
   (b) a resistor connected in series with said capacitor, said resistor and said capacitor interconnecting said source of said modulated signal and said terminal of said device under test; and
   (c) an inductor interconnecting said source of direct current and said terminal of said device under test.

2. The probing system of claim 1 wherein an impedance of said inductor is substantially greater than said device impedance at a frequency of said modulated signal.

3. The probing system of claim 1 wherein an impedance of said resistor is substantially equal to an impedance of an interconnection of said resistor and said source of said modulated signal.

* * * * *